United States Patent [19]

Lambe et al.

[11] 4,164,374
[45] Aug. 14, 1979

[54] SPECTROPHOTOMETER UTILIZING A SOLID STATE SOURCE OF RADIANT ENERGY HAVING A CONTROLLABLE FREQUENCY SPECTRA CHARACTERISTIC

[75] Inventors: John J. Lambe, Birmingham; Shaun L. McCarthy, Ann Arbor, both of Mich.

[73] Assignee: Ford Motor Company, Dearborn, Mich.

[21] Appl. No.: 838,338

[22] Filed: Sep. 30, 1977

Related U.S. Application Data

[63] Continuation-in-part of Ser. No. 836,624, Sep. 26, 1977.

[51] Int. Cl.$^2$ ............................ G01J 3/10; G01J 3/12
[52] U.S. Cl. .................................. 356/402; 250/226; 313/499
[58] Field of Search ............... 356/96, 97, 100, 189, 356/217, 173; 250/226, 552

[56] References Cited

U.S. PATENT DOCUMENTS

| | | | |
|---|---|---|---|
| 3,056,073 | 9/1962 | Mead | 357/6 |
| 3,405,374 | 10/1968 | Dayem et al. | 333/30 R |
| 3,588,253 | 6/1971 | Wittmann | 356/95 X |

OTHER PUBLICATIONS

T. L. Hwang et al., "Plasma Radiation from Tunnel Junctions," Physical Review Letters, vol. 36, No. 7, Feb. 16, 1976, pp. 379-382.
W. Pong et al., "Electroluminescence in Al-Al$_2$O$_3$-Au Diodes," Journal of Applied Physics, vol. 46, No. 5, May 1975, pp. 2310-2312.
J. F. Delord et al., "Correlation between Electroluminescence and Electron Emission of Thin Metal-Oxide-Metal Sandwiches", Applied Physics Letters, vol. 11, No. 9, Nov. 1, 1967, pp. 287-289.
H. Kanter, "Comments on Correlation between Electroluminescence and Electron Emission of Thin Metal-Oxide-Metal Sandwiches", Applied Physics Letters, vol. 12, No. 8, Apr. 15, 1968, pp. 243-244.
Ilambe et al., "Light Emissions from Inelastic Electron Tunneling", Physical Review Letters, vol. 37, No. 14, Oct. 4, 1976, pp. 923-925.
T. W. Hickmott, "Electron Emission Electroluminescence and Voltage Controlled Negative Resistance in Al-Al$_2$O$_3$-Au Diodes," Journal of Applied Physics, vol. 36, No. 6, Jun. 1965, pp. 1885-1896.

*Primary Examiner*—John K. Corbin
*Attorney, Agent, or Firm*—Paul K. Godwin, Jr.; Clifford L. Sadler

[57] ABSTRACT

A solid state source of radiant energy having a characteristic frequency spectra with a high frequency cutoff $v_{co}$, which is a function of the applied voltage value. The source is a metal-insulator-metal tunnel junction wherein the insulator layer is relatively thin with respect to the metal layers and inelastic tunneling occurs. To facilitate output coupling to surface plasmon modes in the junction, the counter-electrode metal layer, from which the radiant energy is emitted, is roughened. One of the uses for the solid state source is as a light source of a spectrophotometer where the transmittance or reflectance band characteristics of a sample are determined by converting the photodetector current to its second derivative and correlating the second derivative with the applied voltage which is modulated over a predetermined range of amplitude values.

16 Claims, 4 Drawing Figures

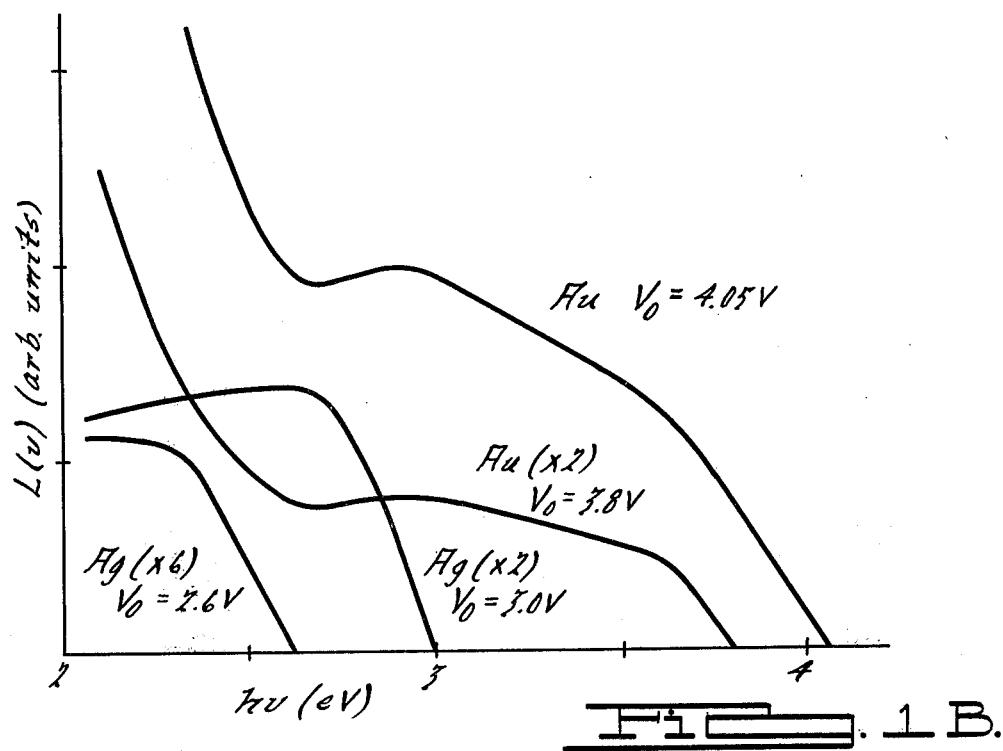
FIG. 1B.
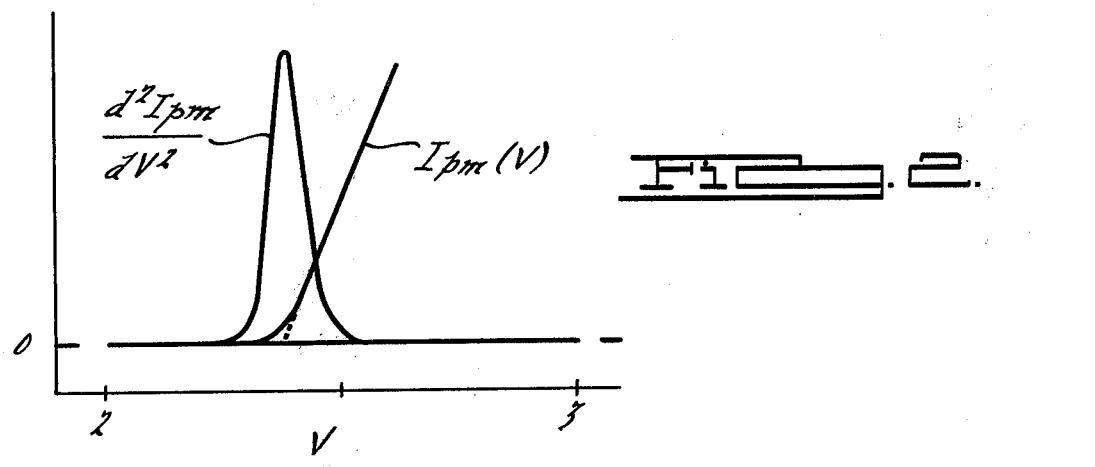
FIG. 2.
FIG. 3.
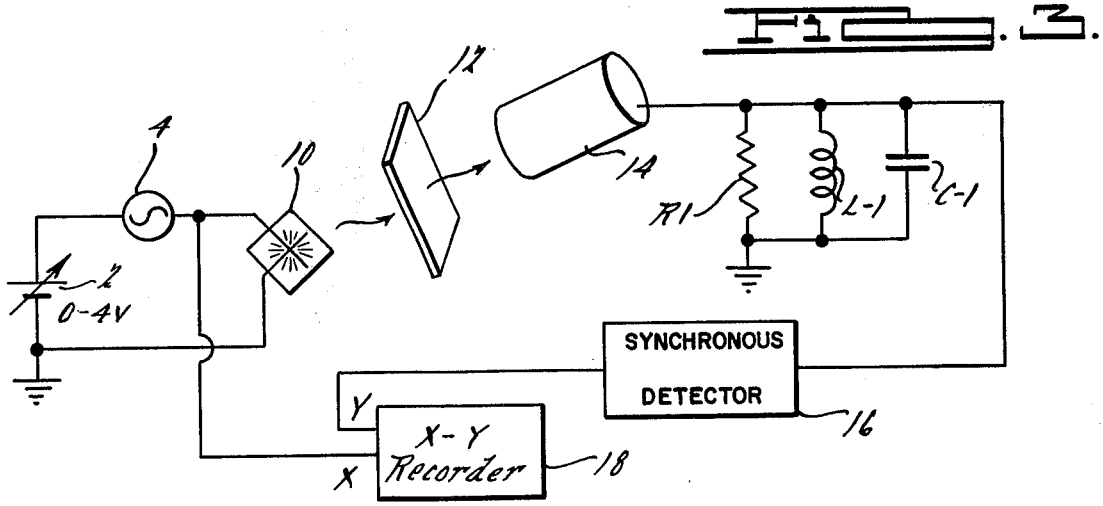

SPECTROPHOTOMETER UTILIZING A SOLID STATE SOURCE OF RADIANT ENERGY HAVING A CONTROLLABLE FREQUENCY SPECTRA CHARACTERISTIC

CROSS REFERENCES TO RELATED APPLICATIONS

This application is a continuation-in-part of U.S. patent application Ser. No. 836,624, filed Sept. 26, 1977.

BACKGROUND OF THE INVENTION

1. Field of the Invention

The present invention relates to a solid state device which responds to values of applied voltage by emitting radiant energy having a known frequency spectra with a predictable high frequency cutoff value $\nu_{co}$ for each value of applied voltage. More particularly, the present invention relates to spectrophotometric uses of the above mentioned solid state radiant energy device.

2. Description of the Prior Art

Numerous electroluminescent solid state devices have been developed, which emit relatively narrow bands of light in response to applied voltages. Such devices are commonly referred to as light emitting diodes (LED) and are commonly constructed as PN junctions wherein the injection of minority carriers into a conductivity type region provides the basis for carrier recombination and gives rise to a narrow band of radiation.

Visual observation of light emitted from metal-oxide-metal (M-O-M) sandwiches was described in early work by J. F. DeLord et al, in an article entitled "Correlation Between Electroluminescence and Electron Emission of Thin Metal-Oxide-Metal Sandwiches", which appeared in Applied Physics Letters, Volume 11, No. 9, Nov. 1, 1967, pages 287–289. In this article, thin sandwich structures of Be-BeO-Au and Al-Al$_2$O$_3$-Ag, having oxide thicknesses of from 100 to 150 A, were described as being constructed to investigate the nature of electron emission. A first type of luminescence was reported as being a bright irreversible disruptive flash or sparkling which permanently altered the characteristics of the device. A second type of luminescence was noted as a very faint bluish glow observed at a low current level on cooled devices. The DeLord et al article concludes that electron emission from the metal-oxide-metal sandwich structures was entirely due to the photoelectric effect caused by electroluminescence produced within the oxide layer.

Later work was described by H. Kanter in an article entitled "Comments on Correlation Between Electroluminescence and Electron Emission of Thin Metal-Oxide-Metal Sandwiches", which appeared in Applied Physics Letters, Volume 12, No. 8, Apr. 15, 1968, pages 243–244. That article indicated Al-Al$_2$O$_3$-Au structures, having oxide layers of 100 A, produce electron current dominated by photoelectron emission released in the top layer through electroluminescence radiation within the oxide at large field strengths created by high voltages in excess of 8 volts.

SUMMARY OF THE INVENTION

As noted in our article entitled "Light Emission From Inelastic Electron Tunneling", published in the Physical Review Letters, Volume 37, Oct. 4, 1976, pages 923–925, and incorporated herein by reference, our invention yields a broad-band light source with a high frequency linear cutoff value that is dependent upon the applied voltage through the quantum relation $h\nu_{co} = |eV|$. The light source is constructed as a metal-insulator-metal tunneling junction, which, when activated by an applied voltage, emits a broad-band of radiation uniformly over the junction area regardless of the polarity of the applied voltage. Light emission from the counter-electrode of the junction is due to inelastic tunneling through a relatively thin oxide insulator, and optical output coupling of surface plasmon modes in the junction is achieved by roughing or etching the counter-electrode to render it slightly porous.

Since the high frequency cutoff value of this broad-band source of radiant energy can be predictively controlled over the visible range, this invention is ideally suited for use as a light source in a new form of spectroscopy. This new form of spectroscopy employs the technique of amplitude modulating the voltage applied to the aforementioned light source to cause scanning of the range of upper cutoff frequencies, while directing the broad-band of emitted radiation to a sample. Where the transmittance or reflectance properties of the sample are desired to be measured, a photodetector is correspondingly oriented to receive the light transmitted or the light reflected from the sample. As the applied voltage is modulated, the high voltage cutoff frequency is correspondingly modulated and will cause a change in the photodetector current at those cutoff frequencies corresponding to the transmittance (reflectance) frequencies of the sample. Therefore, by converting the photodetector current to its second derivative and correlating the peaks of the second derivative with the simultaneously applied voltage values, it is possible to determine the transmittance (reflectance) band of the sample.

Accordingly, it is an object of the present invention to provide a unique solid state source of broadband radiation having an upper cutoff frequency value which is a function of the value of voltage applied to that source.

It is another object of the present invention to provide a solid state light source that provides a broadband spectra of radiation determined by the value of voltage applied thereto.

It is a further object of the present invention to provide a metal-insulator-metal tunneling junction whereby light is emitted therefrom via inelastic tunneling which is nondestructive to the junction.

It is still a further object of the present invention to provide a novel light source in which the upper cutoff frequency can be controlled by corresponding control of the applied voltage value.

It is a further object of the present invention to provide a method of constructing a novel light source comprising a metal-insulator-metal junction whereby the counter-electrode is roughened to provide optical output coupling of surface plasmon modes in the junction.

It is a further object of the present invention to provide a novel source of radiation in both transmission and reflection spectroscopy wherein the modulation of the upper cutoff frequency is monitored to derive the respective transmittance or reflectance characteristics of a sample.

BRIEF DESCRIPTION OF THE DRAWINGS

FIG. 1B is a plot of $L(\nu)$, the photon flux per unit frequency bandwidth versus $h\nu$ for an Au counter electrode junction and an Ag counter electrode junction at different junction bias voltages, wherein the junction temperature is approximately 77° K.

FIG. 2 is a plot showing a typical photodetector current value $I_{pm}$ and a plot of the second derivative of the photodetector current versus the voltage applied to the junction.

FIG. 3 is a schematic diagram of a spectrophotometer employing the novel broad-band light source of the present invention.

DETAILED DESCRIPTION OF THE INVENTION

Figure 1A:
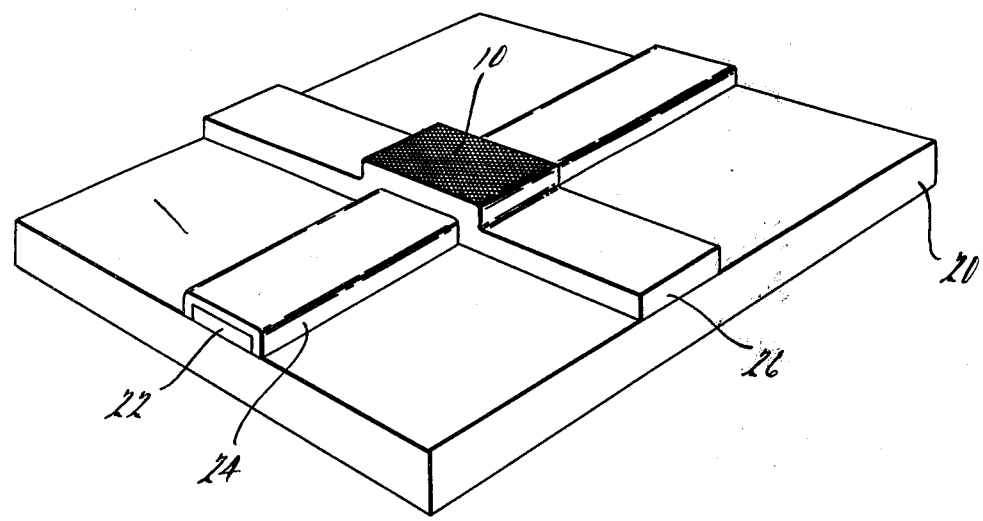
FIG. 1A illustrates the metal-insulator-metal structure of the present invention.

The present invention is a novel light source in the form of a metal-insulator-metal tunnel junction. This invention allows for a unique method of predictably controlling the high frequency cutoff of a broad spectra band of radiated energy by applying known values of voltage to the junction. In this junction, an external electrode, termed a "counter-electrode" is roughened so as to effect optical output coupling to surface plasmon modes which are present in the junction when inelastic tunneling occurs. Inelastic tunneling occurs in this unique junction because of the relatively thin insulator layer, which is heat treated to decrease the tunneling conductance.

As shown in FIG. 1A, a substrate 20 is a support structure for the junction having a first metal electrode 22 deposited thereon. A relatively thin insulating layer 24 covers the first electrode 22 and a counter-electrode 26 is cross-oriented to define the junction area 10. In operation, voltage is applied between the first electrode and the counter-electrode.

Fabrication of the unique solid state source of radiant energy, schematically illustrated in FIG. 1, is performed in a manner similar to the fabrication of the tunnel junction described in commonly assigned U.S. Pat. No. 3,469,184.

In the preferred embodiment, aluminum was selected as a first metal electrode 22 to be evaporated onto the support substrate 20 because of its high optical reflectivity and low electrical resistance. Samples of the junction were fabricated having aluminum film thicknesses ranging from approximately 200 to 1000 Å and found to have favorable performance characteristics. Following the formation of the first electrode film 22, an insulating layer 24 was formed thereon. Since aluminum was selected as the first electrode 22 of the preferred embodiment, the aluminum film was oxidized in order to form an optically non-absorbing insulating layer 24 of $Al_2O_3$. An insulating layer having a thickness of approximately 30 Å was found to be adequate to withstand voltages of up to 4 volts and to conduct sufficient tunneling current so that light can be observed.

Following the formation of the insulating layer 24, a counter-electrode 26 having a thickness in the range of approximately 100-300 Å was evaporated over a portion of the insulating layer, while the substrate was cooled to approximately 77° K. It was found that counter-electrodes of Ag, Au, Pb or In were operational, while Ag was preferred because of its low optical absorption characteristics. Following the formation of the counter-electrode 26, wherein the common area of insulating layer and first electrode overlayed by the counter-electrode forms the tunnel junction 10, a mild etch solution was used to roughen the counter-electrode 26 and render it slightly porous. This was done to provide optical output coupling to the surface plasmon modes in the junction.

Etching of the Ag counter-electrode material, in the above example, was performed by exposing the counter-electrode to Br. A 0.01% solution of Br in carbon tetrachloride at room temperature was supplied, and the junction was dipped therein for approximately 15 seconds. The junction was then removed to the atmosphere and heated to approximately 150° C. for approximately 1 minute. The heating of the junction causes a decrease in the tunneling conductance and thus limits the current at a peak bias voltage of approximately 4 volts. The sample junctions described above have an area of approximately $5 \times 10^{-2} cm^2$ and have a zero bias conductance of approximately $10^{-2} mho/cm^2$.

When voltage is applied to the electrodes 22 and 26, visible light emanates from the entire junction area 10 and the emission is observed to change from deep red, at low voltage, to orange to blue-white as the voltage is increased.

We believe that the light emission is due to inelastic tunneling in the junction (LEIT) and is due to tunneling electrons which excite an optically coupled surface plasmon mode in the junction with a frequency $\nu$, provided that $|eV| \geq h\nu$. Such a notion presumes that a threshold is established for inelastic tunneling vibrational spectra.

At very low temperatures, the form of the inelastic excitation will be $L(\nu) = P(\nu,V) (|V|-h\nu/e)\theta(|V|-h\nu/e)$, where $L(\nu)$ is the number of photons emitted with frequency within the interval $d\nu$. $P(\nu,V)$ is a slowly varying function of frequency and voltage involving the density of surface modes and the inelastic excitation and radiation probabilities. $\theta(|V|-h\nu/e)$ is the step function that reflects the cutoff of photon emission at the quantum condition. Thus, a linear cutoff is predicted in the spectra as $h\nu$ approaches $|eV|$.

In FIG. 1B, a plot of $L(\nu)$, the photon flux per unit frequency bandwidth, versus $h\nu$ for both Au and Ag counter-electrode junctions is indicated for different junction bias voltages when the junctions are maintained at 77° K. Although the light emission effect can be observed at room temperature, higher stability was found to be maintained at 77° K.

As can be seen from FIG. 1B, when the bias voltage across the tunnel junction, utilizing an Au counter-electrode, has a value of 3.8 volts, the frequency spectra shows a sharp cutoff frequency at approximately 3.8 electron volts. When the biasing voltage is changed to 4.05 volts, the frequency spectra of the tunnel junction employing the Au counter-electrode shows a high frequency cutoff value of approximately 4.05 electron volts. Although the measurement of $L(\nu)$ of photon flux per unit frequency bandwidth is shown in arbitrary units along the "Y" axis of the plot in FIG. 1B, it can be seen that as the biasing voltage is lowered, the value of $L(\nu)$ increases by the indicated orders of magnitude (see the parentheses following the counter-electrode element legend).

Improved results are indicated in FIG. 1B when an Ag counter-electrode is employed. In that case, when a biasing voltage of 3.0 volts is applied across the junction, the high frequency cutoff value of the radiated spectra is seen at 3 electron volts. Similarly, when a biasing voltage of 2.6 volts is applied across the tunnel junction having an Ag counter-electrode, the high frequency cutoff value is approximately 2.6 electron volts.

For each of the metals selected for use as counter-electrodes, it was observed that the high frequency cutoff value is a linear function of the value of applied voltage, and as the voltage is increased from zero, more and more of the visible spectrum is radiated. It was further found that the broadband emission is not significantly effected by the polarity of the biasing voltage since the relation $h\nu_{co}=|eV|$ is unaffected by sign reversal. However, when the direction of the tunneling current is reversed, there is some change in intensity.

With co-reference to FIGS. 2 and 3, a unique spectrophotometer is schematically illustrated which uses the novel solid state light source described above. In the illustrated spectrophotometer, a sample 12 is located in the path of radiation emitted from the solid state source 10. A photomultiplier detector 14 is located to receive radiation transmitted through the sample 12. A variable power supply is connected to the electrodes of the source 10 to cause scanning of the high frequency cutoff value over the emitted light spectrum. The power supply includes a DC source 2 which is adjustable between zero to 4 volts, and is connected between ground and one terminal of an AC generator 4. In this instance, the AC generator 4 amplitude modulates the voltage of the DC power source 2 at approximately 50 KHz. The modulated voltage is then applied to the two electrodes of the junction 10. In the illustrated example, the sample 12 has a transmittance band centered about 2.4 electron volts (5,132 Å—green). Therefore, when the applied voltage is caused to scan in value, the junction emits a spectra having its high frequency cutoff value correspondingly scanned. Accordingly, when the high frequency cutoff value scans past 2.4 electron volts, the photomultiplier detector 14 will correspondingly generate a change in detection current $I_{pm}$. A tuned circuit comprising resistor R1, inductor L1 and capacitor C1 is connected to the output of the photomultiplier detector 14 for selecting the second harmonic of the 50 KHz modulating frequency. The second harmonic signal from the tuned circuit is proportional to the second derivative of the photomultiplier detector current $I_{pm}$ and therefore is indicative of the sample band of transmittance. In this particular embodiment, resistor R1 of the tuned circuit has a value of 1MΩ, the inductor L1 has a value of 3mh and the capacitor C1 has a value of 850 pf.

A synchronous detector 16 receives the second harmonic input and generates a DC output signal, which is proportional to the second derivative of the photomultiplier detector current $I_{pm}$. The second derivative signal is then correlated with the scanned voltage applied to the junction 10 in order to determine the location of second derivative peaks with respect to the value of applied voltage to the junction 10. In FIG. 3, an X-Y recorder 18 is shown having its X terminal connected to the output of the AC modulator 4 and its Y terminal connected to receive the second derivative signal. It is understood that in the alternative an oscilloscope or any other display system having an X-Y coordinate system input could be used.

Although the spectrophotometer in FIG. 3 is shown to monitor the transmittance characteristics of the sample 12, it should be understood that reflectance properties of samples can also be measured by repositioning the source junction 10, the sample 12, and the photomultiplier 14 so that the photomultiplier 14 receives reflected light instead of transmitted light.

It will be apparent to those skilled in the art that many modifications as to the particular materials and elemental configurations may be made without departing from the scope of this basic invention. Therefore, the foregoing embodiments of the present invention should be interpreted as being examples of the preferred mode known at this time and not restrictive of the scope of the appended claims.

We claim:

1. A solid state source of visible radiant energy comprising:
   a first electrode element;
   an insulating layer overlying said first electrode element; and
   a counter-electrode overlying said insulating layer to form a tunnel junction which generates surface plasmon modes in response to voltage applied between said first electrode and said counter-electrode, wherein said counter-electrode includes means for providing optical output coupling of said surface plasmon modes in a visible light spectra having a high frequency cutoff $\nu_{co}=|eV|/h$, wherein h is the Planck constant, e is the electron charge and V is the value of the applied voltage, employed in a spectrophotometer apparatus comprising:
   a modulating power supply connected to said source;
   a sample located to receive radiation from said source; means for detecting the radiation transmitted through said sample; and
   means connected to said detecting means for indicating the transmittance characteristics of said sample.

2. An apparatus as in claim 1, wherein said power supply amplitude modulates a DC voltage applied to said source;
   said detecting means generates current in response to radiation transmitted through said sample; and
   said indicating means generates a signal which is a second derivative of the current generated by the detecting means.

3. An apparatus as in claim 2, wherein said power supply includes means for amplitude modulating said applied voltage at a preselected frequency.

4. An apparatus as in claim 3, wherein said indicating means also includes means for plotting said second derivative signal with respect to the amplitude of applied voltage.

5. An apparatus as in claim 3, wherein said indicating means includes a filter circuit tuned to pass the second harmonic of said preselected frequency in the current generated by the detecting means.

6. A solid state source of visible radiant energy comprising:
   a first electrode element;
   an insulating layer overlying said first electrode element; and
   a counter-electrode overlying said insulating layer to form a tunnel junction which generates surface plasmon modes in response to voltage applied between said first electrode and said counter-electrode, wherein said counter-electrode includes means for providing optical output coupling of said surface plasmon modes in a visible light spectra having a high frequency cutoff $\nu_{co}=|eV|/h$, wherein h is the Planck constant, e is the electron charge and V is the value of the applied voltage, employed in a spectrophotometer apparatus comprising:

a modulating power supply connected to said source;

a sample located to receive radiation from said source;

means for detecting the radiation reflected from said sample; and means connected to said detecting means for indicating the reflectance characteristics of said sample.

7. An apparatus as in claim 6, wherein said power supply amplitude modulates a DC voltage applied to said source;

said detecting means generates current in response to radiation reflected through said sample; and said indicating means generates a signal which is a second derivative of the current generated by the detecting means.

8. An apparatus as in claim 7, wherein said power supply includes means for amplitude modulating said applied voltage at a preselected frequency.

9. An apparatus as in claim 8, wherein said indicating means also includes means for plotting said second derivative signal with respect to the amplitude of applied voltage.

10. An apparatus as in claim 8, wherein said indicating means includes a filter circuit tuned to pass the second harmonic of said preselected frequency in the current generated by the detecting means.

11. A method of measuring a band of transmittance frequencies of a sample including the steps of:

providing a source of radiant energy having broadband spectra properties of emission with a predetermined high frequency cutoff which is a function of the voltage applied to said source;

providing a voltage supply for applying said voltage to said source;

providing a sample in the path of said radiant energy from said source;

providing a detector for receiving said radiant energy transmitted through said sample and generating a current signal in response to said received energy;

applying the voltage from said supply to said source, causing said energy to radiate;

modulating said applied voltage over a predetermined range of values;

converting said current signal to a second derivative signal; and correlating said second derivative signal with said applied voltage values to determine a band of transmittance frequencies for said sample.

12. A method as in claim 11, wherein an X-Y recorder is provided which is connected to receive said second derivative signal and said applied voltage and performs said step of correlation by plotting said second derivative signal with respect to said applied voltage.

13. A method as in claim 11, wherein said step of converting is performed by extracting the second harmonic of said modulated voltage from said current signal and detecting the amplitude of said second harmonic signal.

14. A method of measuring a band of reflectance frequencies of a sample including the steps of:

providing a source of radiant energy having broadband spectra properties of emission with a predetermined high frequency cutoff which is a function of the voltage applied to said source;

providing a voltage supply for applying said voltage to said source;

providing a sample in the path of said radiant energy from said source;

providing a detector for receiving said radiant energy reflected from said sample and generating a current signal in response to said received energy;

applying the voltage from said supply to said source, causing said energy to radiate;

modulating said applied voltage over a predetermined range of values;

converting said current signal to a second derivative signal; and correlating said second derivative signal with said applied voltage values to determine a band of reflectance frequencies for said sample.

15. A method as in claim 14, wherein an X-Y recorder is provided which is connected to receive said second derivative signal and said applied voltage and performs said step of correlation by plotting said second derivative signal with respect to said applied voltage.

16. A method as in claim 14, wherein said step of converting is performed by extracting the second harmonic of said modulated voltage from said current signal and detecting the amplitude of said second harmonic signal.

* * * * *